United States Patent [19]

Lorans

[11] 4,041,271
[45] Aug. 9, 1977

[54] MACHINE FOR WELDING SOLAR CELL CONNECTIONS

[75] Inventor: Dominique Y. Lorans, Paris, France

[73] Assignee: Societe Anonyme de Telecommunications, Paris Cedex, France

[21] Appl. No.: 652,247

[22] Filed: Jan. 26, 1976

[30] Foreign Application Priority Data

Jan. 10, 1975 France ............................. 75.03126

[51] Int. Cl.² ............................................ B23K 11/10
[52] U.S. Cl. .................................. 219/86; 228/1 R; 228/4.5
[58] Field of Search .................. 228/1, 4.5; 219/85 F, 219/86

[56] References Cited

U.S. PATENT DOCUMENTS

| 3,186,446 | 1/1965 | Hunt | 228/4.5 |
| 3,384,283 | 5/1968 | Mims | 228/1 |
| 3,767,101 | 10/1973 | Genrich | 228/4.5 |
| 3,790,738 | 2/1974 | Laub | 219/85 F |

*Primary Examiner*—E. A. Goldberg

[57] ABSTRACT

Machine for welding a connection wire over a solar cell electrode which comprises a base, a welding mount for the solar cell which is supported on the base, means for holding the solar cell on the welding mount, welding electrodes, means to lower the welding electrodes over the solar cell and the connection wire superimposed thereon, means for applying electric current pulses to said welding electrodes, and it is characterized by the fact that it further comprises means for imparting to said mount an alternating transverse movement in relation to said base before and during the welding operation.

2 Claims, 6 Drawing Figures

MACHINE FOR WELDING SOLAR CELL CONNECTIONS

BACKGROUND OF THE INVENTION

1. Field of the invention

The present invention concerns a machine intended for the welding of connections on solar cell electrodes and, more particularly, on silicon solar cells.

It is known that solar cells are built of a silicon wafer a first face of which is doped in a given conductivity type, then entirely covered with a silver coating to form one of the cell electrodes, and the second face of which is doped in the opposite type of conductivity, then covered by a silver coating in the form of a grid, the latter coating allowing for solar rays to penetrate down to the silicon wafer. It is this second face which is the sensitive face. A connection, usually a silver strip, is electrically welded to each electrode at a specific spot.

2. Description of the Prior Art

In accordance with prior state-of-the-art practice, welding of solar cell connections is achieved by applying the silver strip representing the connection which is placed at a given spot on the cell electrode with the cell being mounted between the abutting and parallel electrodes of an electric-pulsed welding machine. Such pulsed welding units are available on the market. They allow for the pressure adjustment which is required so that their electrodes press on the areas to be welded and also adjust for pertinent current and time of welding pulse.

It has occurred in the past that weldings implemented without properly preparing the cell electrode were of poor quality, mechanically - insofar as concerns their resistance to being pulled away from the connection — as well as electricity — insofar as concerns the preservation of the required cell electrical characteristics. Thus, still within the known state-of-the-art, the electrode part to weld which is to be subjected to the electrical welding operation of the cell electrode is either prepared chemically or mechanically to meet these requirements for mechanical and electrical quality. A known chemical preparation consists in cleaning the surface to be welded with potassium cyanide. Not only the use of this product is dangerous but results obtained are not entirely satisfactory. A known mechanical preparation involves smoothing out the surface to be welded with an eraser. This procedure gives rather satisfactory results but it is relatively long and delicate, particularly for the sensitive face electrode and it requires added cell cleaning before the welding procedure in order to eliminate residual eraser traces.

OBJECT OF THE INVENTION

The object of this invention is to provide apparatus which is specifically designed for the welding of solar cell electrode connections which will then be endowed with electrical characteristics that are as good as with previous methods and with better mechanical resistance, although such connection welding would be no longer require prior chemical cleaning or mechanical erasing treatment of the solar cell.

SUMMARY OF THE INVENTION

The welding machine of the invention serves to weld a connection to the silvered surface of a silicon wafer solar cell and comprises a base, a welding mount rigidly secured to the base, an upper surface of the welding mount having means, such as suction means, to hold the wafer along a reference line in plane for the welding operation, a welding electrode over the mount and cell adapted to be pressed against a connection and the cell and triggered for a pulse of predetermined period and under preselected pressure and electromagnetic means to impart to the upper surface wafer and connection an alternating transverse motion of predetermined amplitude and frequency. This movement under pressing action of the electrode causes friction between the connection and wafer and consequently a tinning action at the area welded. Electrical and mechanical properties of the weld are improved.

One means to impart the alternating movement is provided by flat springs between the lower and upper parts of the welding mount which cooperates with an electromagnet alongside of the mount, the electromagnetic being energized with alternating current of preselected frequency and amplitude to induce movement by the upper part of the mount which is provided with a magnetic member along a face defining a gap between the mount and the electromagnet.

BRIEF DESCRIPTION OF THE DRAWINGS

The invention will be more clearly understood by reference to the following description and to the accompanying drawings wherein.

DESCRIPTION OF THE PREFERRED EMBODIMENT

Figure 1A:
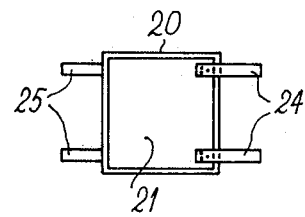
FIGS. 1a and 1b represent a solar cell of known type.
Figure 1B:
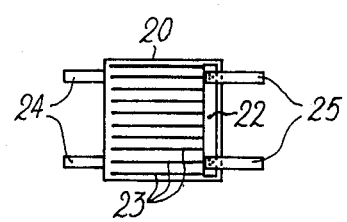

FIGS. 1a an 1b represent a known solar cell. This solar cell is composed of a silicon wafer 20, doped in different conductivity types on both faces so as to form a p-n junction, and covered on its rear face (FIG. 1a) with an electrode represented by a silver film 21 substantially covering the whole wafer surface. On its front face (FIG. 1b) an electrode, shaped as a wide line 22 along an edge of the wafer and then parallel lines 23 starting from said wide line and perpendicular thereto, is deposited through silver vaporization in vacuum. To the rear electrode 21 and over the portion 22 of the front electrode, the silver connections 24 and 25 are welded. The instrument of the present invention has for its purpose to ease the task of imprementing these welds.

Figure 2:
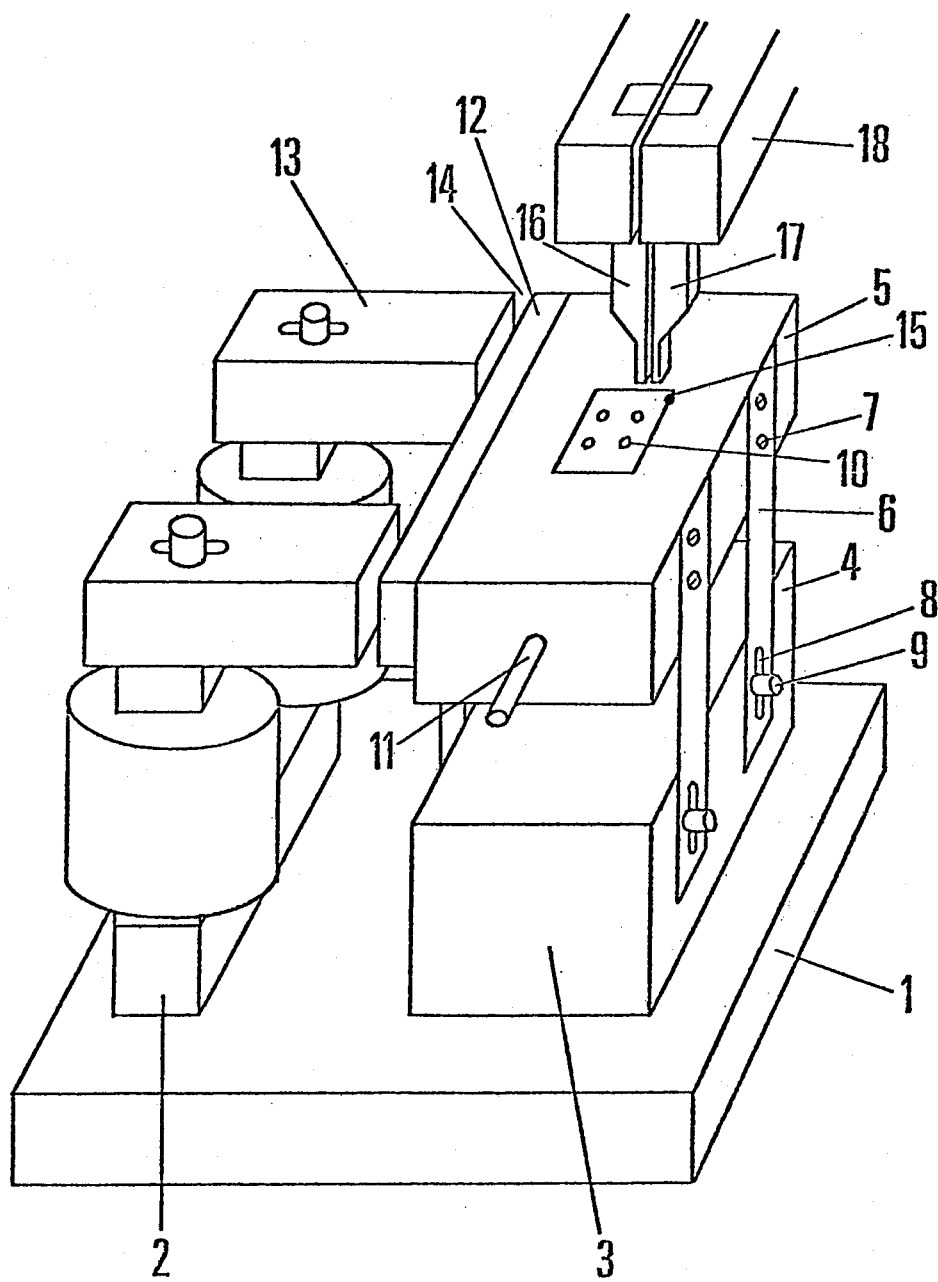
FIG. 2 shows the welding machine for solar cell connections.

Referring now to FIG. 2, it is to be noted that the welding machine includes a base 1 on which an electromagnet 2 is fastened as well as a welding mount 3. The welding mount is composed of a lower part 4 that is rigidly fastened to base 1 and an upper part 5 resiliently held by the lower part 4 by means of four flat springs 6. These flat springs are rigidly fastened to the upper part 5 of the welding mount by means of screws 7, and also rigidly, but in an adjustable manner, to the lower part 4 of this mount. To do so, the spring blades 6 are drilled with oval holes 8 in which screws 9 are fitted.

The upper part 5 of the welding mount is drilled with holes 10 which are intended to hold the solar cell in place by suction over the welding mount. Holes 10 communicate with a duct 11 and an intake system connected over this duct. The upper part 5 of the welding mount can be built of magnetic material; otherwise, a magnetic piece 12 may be fastened on it laterally. Over the poles of electromagnet 2, magnetic parts 13 are fastened. Their positioning is adjustable so that the size of gap 14 may vary at will.

The upper face of upper part 5 of the welding mount includes lines 15 used to reference the position of the solar cell and of the connection. It is also possible to provide a cup shaped portion over this upper part in order to fit in the solar cell whose connections are to be welded.

The two welding electrodes are shown at 16 and 17, fastened over head 18 of the welding machine, not shown on the figure. This machine enables to apply, with a pre-selected pressure and at a predefined spot, the electrodes 16 and 17 on the connection and the solar cell that were previously positioned. Adjustment of spring blades 6 enables to select the frequency needed to vibrate the upper part 5 of the welding mount under the action of the electromagnet 2, through gap 14. Vibration amplitude may be adjusted by varying either gap width 14 or coil voltage of the electromagnet. For instance, good results may be obtained by using a vibration frequency of 100 to 120 Hz so that the electromagnet coils may be fed with mains voltage.

The silver tinning phenomenon of the cell electrode is quickacting — in the order of a second. However, vibration is held constant for a while longer and also during welding pulse, because it has been realized that the fact of implementing this welding while keeping these vibrations going has a favorable influence on the mechanical quality and visual appearance of the weld.

The following operating methodology is advised when using the instrument of this invention:
 — position the cell and connection while holding the cell through suction;
 — lower electrodes and effect pressurizing while monitoring connection position;
 — start operating the electromagnet;
 — 2 or 3 seconds later, trigger welding pulse;
 — stop the electromagnet;
 — lift the electrodes.

The electrical characteristics of 2 lots of 60 solar cells were measured, one lot being erased before welding and the other being welded under vibration. The mean values of open circuit voltage $V_{oc}$ in millivolts, of the short-circuit current $I_{sc}$ in milliammeters, and of the load current in milliammeters under a voltage of 445 millivolts $I_{445}$, are given on the following Table:

|  | $V_{oc}$(mV) | | $I_{sc}$(mA) | | $I_{445mV}$(mA) | |
| --- | --- | --- | --- | --- | --- | --- |
|  | Pro-Weld. | Post-Weld. | Pro-Weld. | Post-Weld. | Pro-Weld. | Post-Weld. |
| Welds on erased cells | 553.3 | 551.3 | 150.8 | 149.8 | 142.2 | 139.8 |
| Welds under vibration | 553.6 | 552.6 | 151.3 | 151.2 | 141.3 | 141.1 |

Figure 3A:
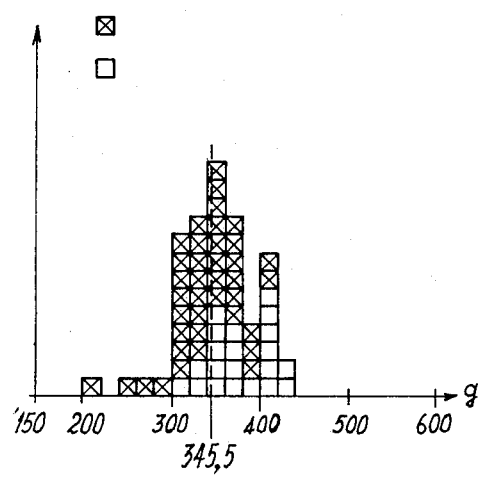
FIGS. 3a, 3b, 3c represent curves indicating the tractive resistance of connections for cells that were not treated before welding, then cells which were erased before welding, then cells which were welded under vibration, respectively.
Figure 3B:
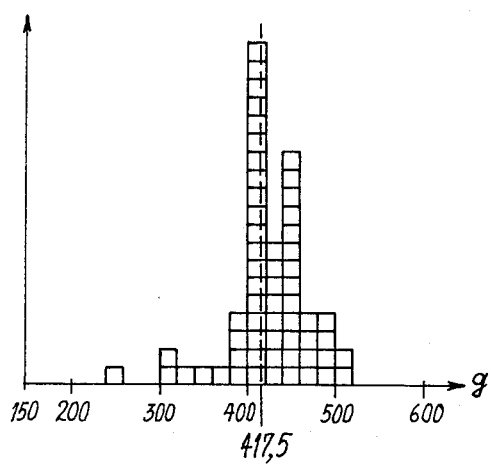
Figure 3C:
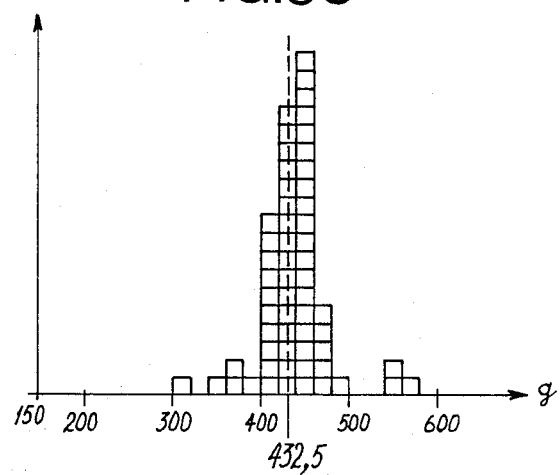

It can be seen that the welding of solar cell electrodes generates a slight lowering of $V_{oc}$, $I_{sc}$, $I_{445}$, and that such lowering is of a lesser extent in the case of the present invention than it is in the case of prior state-of-the-art. The pull resistance of connections was also measured by applying tractive forces increasing by discrete values at the connection slanted by 45° in relation to the wafer, and by considering the cells as bad or good, for a given tractive force, for respectively those cells whose connections "pulled away" for said force or tore away near the weld due to this same force. FIG. 3a relates to welds which had not undergone any previous cell treatment. FIG. 3b relates to welds once the cell was erased, and FIG. 3c shows welds made under vibration. It can be seen on FIG. 3a that the average power of this force under which connections tear away or break is 345.5 grams and that for this given value there is a large percentage of bad cells. This same average is 417.5 grams for connections over erased cells, and 432.5 grams for vibrated connections without any prior treatment of the cells. Moreover, in the last two cases, all cells are good in function of the previously-described definition.

The invention was described for the case of solar cells because the use of such cells on space satellites results in subjecting them to extremely stringent temperature changes generating severe connection mechanical stresses. Although, it may prove less useful for other systems with a p-n junction, such as light emitting diodes and laser diodes which are not subjected to such intense temperature changes as those for solar cells, the invention is nevertheless applicable to other systems using the junction p-n.

What I claim is:

1. A welding machine for welding a connection to a silvered surface of a silicon wafer solar cell comprising:
 a base;
 a welding mount rigidly secured to said base having an indexed upper surface for positioning the solar cell along a reference line serving as the index line;
 an electrical connection on said upper surface for energizing said solar cell at its silvered surface;
 holding means on said welding mount for holding said solar cell in place on said upper surface;
 at least one welding electrode over said upper surface;
 means to lower said welding electrode to make pressuring contact with said electrical connection and said solar cell;
 trigger pulse means to apply electric current pulses to said electrode cell and electrical connection means for a preselected time period and at preselected pressures;
 the upper surface of said welding mount being in an upper part of said mount which is fastened to the lower part of said mount by a spring means;
 an electromagnetic means to impart to the upper part of said welding mount on alternating movement on transverse to said reference line, said alternating transverse movement being of predetermined frequency and predetermined amplitude;
 said electromagnetic means comprising an electromagnet fastened to said base, positioned next to said welding mount and including a gap between said electromagnet and said mount;
 said spring means between the upper and lower parts of said mount below said silicon wafer responding to the vibrations imparted by said electromagnetic means through said gap; and,
 adjustable wafer holding means formed as flat springs with oval holes and fastening means attached thereto for holding said silicon wafer solar cell.

2. A welding machine according to claim 1 wherein said adjustable wafer holding means comprises a cup shaped recess and includes at least one duct emerging from said recess fitted with suction means operative in said duct to hold said silicon wafer solar cell.

* * * * *